US008954948B2

(12) United States Patent
Berner et al.

(10) Patent No.: US 8,954,948 B2
(45) Date of Patent: Feb. 10, 2015

(54) OBSOLESCENCE TOLERANT FLASH MEMORY ARCHITECTURE AND PHYSICAL BUILDING BLOCK (PBB) IMPLEMENTATION

(75) Inventors: Andrew Berner, Endicott, NY (US); Kevin Hill, Vestal, NY (US)

(73) Assignee: BAE Systems Controls Inc., Johnson City, NY (US)

( * ) Notice: Subject to any disclaimer, the term of this patent is extended or adjusted under 35 U.S.C. 154(b) by 712 days.

(21) Appl. No.: 13/163,120

(22) Filed: Jun. 17, 2011

(65) Prior Publication Data
US 2012/0320517 A1 Dec. 20, 2012

(51) Int. Cl.
G06F 9/445 (2006.01)
H01L 21/00 (2006.01)
H05K 7/00 (2006.01)

(52) U.S. Cl.
CPC G06F 8/65 (2013.01); H01L 21/00 (2013.01); H05K 7/00 (2013.01); G06F 8/665 (2013.01)
USPC .......................... 717/168; 717/172; 717/178

(58) Field of Classification Search
None
See application file for complete search history.

(56) References Cited

U.S. PATENT DOCUMENTS

| 5,783,870 A | 7/1998 | Mostafazadeh et al. |
| 6,294,406 B1 | 9/2001 | Bertin et al. |
| 7,062,738 B1 | 6/2006 | Chu et al. |
| 7,245,008 B2 | 7/2007 | Lee |
| 7,279,795 B2 | 10/2007 | Periaman et al. |
| 7,508,069 B2 | 3/2009 | Wehrly, Jr. et al. |
| 7,569,473 B2 | 8/2009 | Lee et al. |
| 2004/0084771 A1 | 5/2004 | Bolken et al. |
| 2009/0204750 A1* | 8/2009 | Estakhri et al. ............... 711/103 |

FOREIGN PATENT DOCUMENTS

| JP | 2005-026680 A | 1/2005 |
| JP | 2006-323739 A | 11/2006 |

* cited by examiner

Primary Examiner — Chuck Kendall
(74) Attorney, Agent, or Firm — Scully, Scott, Murphy & Presser, P.C.

(57) ABSTRACT

An electronic module and method for updating an electronic device wherein the electronic module is connected to a circuit board having one or more memory interfaces which may be embodied as processors in the electronic device. One or more semiconductor devices electrically communicate with an electrical circuit within the module. A programmable memory device including non-volatile memory electrically communicates with the electrical circuit of the electronic module. The programmable memory device includes a program having code saved therein. The code defines a multiplicity of functions for the electronic module for communication between the electronic module and a memory interface or processor of the electronic device. Electrical connection elements are attached to a substrate on a bottom side of the electronic module for electrically connecting the electrical circuit of the electronic module to the circuit board for communication between the programmable memory device and the memory interface or processor.

12 Claims, 4 Drawing Sheets

OBSOLESCENCE TOLERANT FLASH MEMORY ARCHITECTURE AND PHYSICAL BUILDING BLOCK (PBB) IMPLEMENTATION

FIELD OF THE INVENTION

The present invention generally relates to upgrading an electronic device, and more specifically, upgrading a semiconductor device with an upgraded electronic module which communicates with a memory device or a processor of the electronic device.

BACKGROUND OF THE INVENTION

In the field of art, an electronic device may include one or more semiconductor devices or packages, such as semiconductor chips and memory units or cards, which may be connected to a circuit board or printed circuit board. The circuit board may further include one or more processors, or a central processing unit (CPU). The semiconductor devices may include an electronic module such as an encapsulated semiconductor module, which may include a memory device, or a semiconductor chip or die having circuitry, and connection elements for electrically connecting the chip to the circuit board. In order to upgrade the electronic device, for example, for a new encapsulated semiconductor module which may be embodied as upgraded flash memory, the software of the electronic device is upgraded in addition to adding the new module. Thus, for hardware and software upgrades of electronic modules in the electronic device, an upgrade to a software interface of the electronic device is also required. Further, the electronic device may include multiple modules from different manufacturers, each of which requires its own software interface for the electronic device to communicate with the module. In cases where the electronic device is related to equipment that must be certified, such as military equipment, the electronic device needs to be re-certified with every hardware and software upgrade. The cost and labor time associated with the re-certification are both undesirable. Therefore, known electronic devices do not readily allow for rework such as upgrading, e.g., increasing memory in the electronic device, thus resulting in undesirable cost and labor for upgrades, as well as re-certifications.

Therefore, a need exists for a device and method to upgrade an electronic device in the scenario as described above, which reduces costs and labor time, and eliminates the need for re-certification of the electronic device.

SUMMARY OF THE INVENTION

In an aspect of the invention, an electronic module for updating an electronic device includes the electronic module being connected to a circuit board having a memory interface for the electronic device. The electronic module includes at least one semiconductor device electrically communicating with an electrical circuit within the electronic module. A programmable memory device includes non-volatile memory. The programmable memory device electrically communicates with the electrical circuit of the electronic module. The programmable memory device includes a program having code saved in the programmable memory device which is a non-transitory computer readable storage media. The code defines a multiplicity of functions for the electronic module for communication between the electronic module and a memory interface on a circuit board of the electronic device, wherein the memory interface communicates with a non-transitory computer readable storage medium. Electrical connection elements are attached to a substrate on a bottom side of the electronic module for electrically connecting the electrical circuit of the electronic module to the circuit board for communication between the programmable memory device and the memory interface.

In another aspect of the invention, a method of updating an electronic device by connecting an electronic module to a circuit board has a memory interface of the electronic device, and comprises: connecting at least one semiconductor device to an electrical circuit within the electronic module; connecting a programmable memory device having non-volatile memory to the electronic module, the programmable memory device electrically communicating with the electrical circuit of the electronic module; programming the programmable memory device being a non-transitory computer readable storage media with a program including code saved in the programmable memory device; defining a multiplicity of functions for the electronic module using the code for communication between the electronic module and a memory interface on a circuit board of the electronic device, wherein the memory interface communicates with a non-transitory computer readable storage medium; and electrically connecting the electronic module to the circuit board through a substrate for communication between the memory interface of the electronic device and the programmable memory device.

In another aspect of the invention, a method of manufacturing an electronic module for updating an electronic device by connecting an electronic module to a circuit board has a memory interface of the electronic device, and comprises: connecting at least one semiconductor device to an electrical circuit within the electronic module; connecting a programmable memory device having non-volatile memory to the electronic module, the programmable memory device electrically communicating with the electrical circuit of the electronic module; programming the programmable memory device being a non-transitory computer readable storage media with a program including code saved in the programmable memory device, the code defining a multiplicity of functions for the electronic module for communication between the electronic module and a memory interface on a circuit board of the electronic device, wherein the memory interface communicates with a non-transitory computer readable storage medium; and electrically connecting the electronic module to the circuit board through a substrate for communication between the memory interface of the electronic device and the programmable memory device.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION OF THE INVENTION

Figure 1:
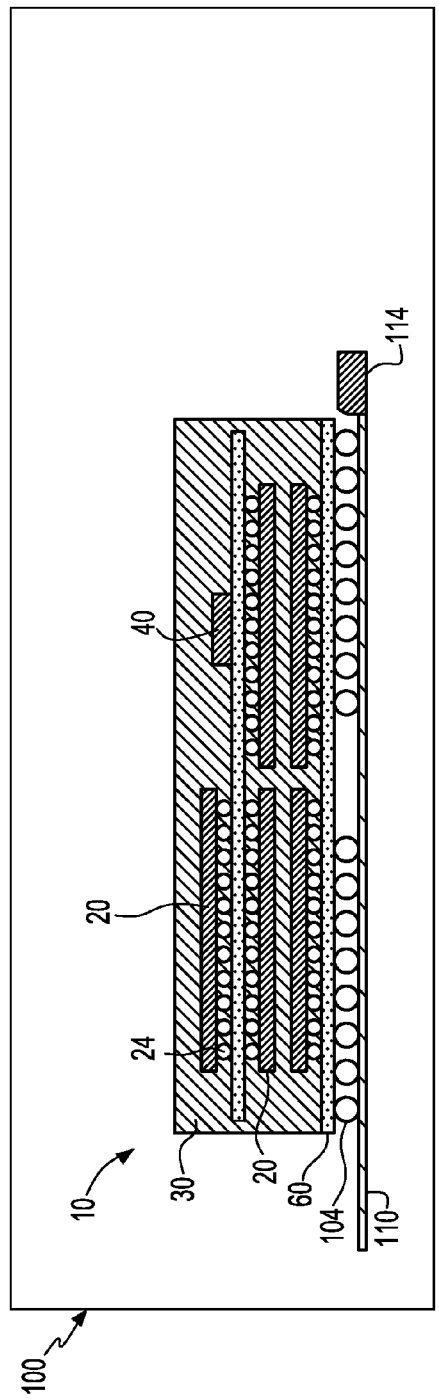
FIG. 1 is a cross sectional side elevational view of an electronic device and electronic module according to an embodiment of the invention.

Referring to FIG. 1, an embodiment of the invention includes an electronic module embodied as a semiconductor module 10 for updating an electronic device 100. The electronic module or semiconductor module 10 may be a physical building block (PBB) module. A PBB may use a combination of advanced system in package (SIP) technologies. The SIP technologies may include, for example: a bare die such as wire bond or flip chip technologies; a stacked die; wafer level packages; an assembled die; and stacked packages. The electronic module 10 is a stacked die type of module or package, or may be considered an encapsulated package.

Figure 3:
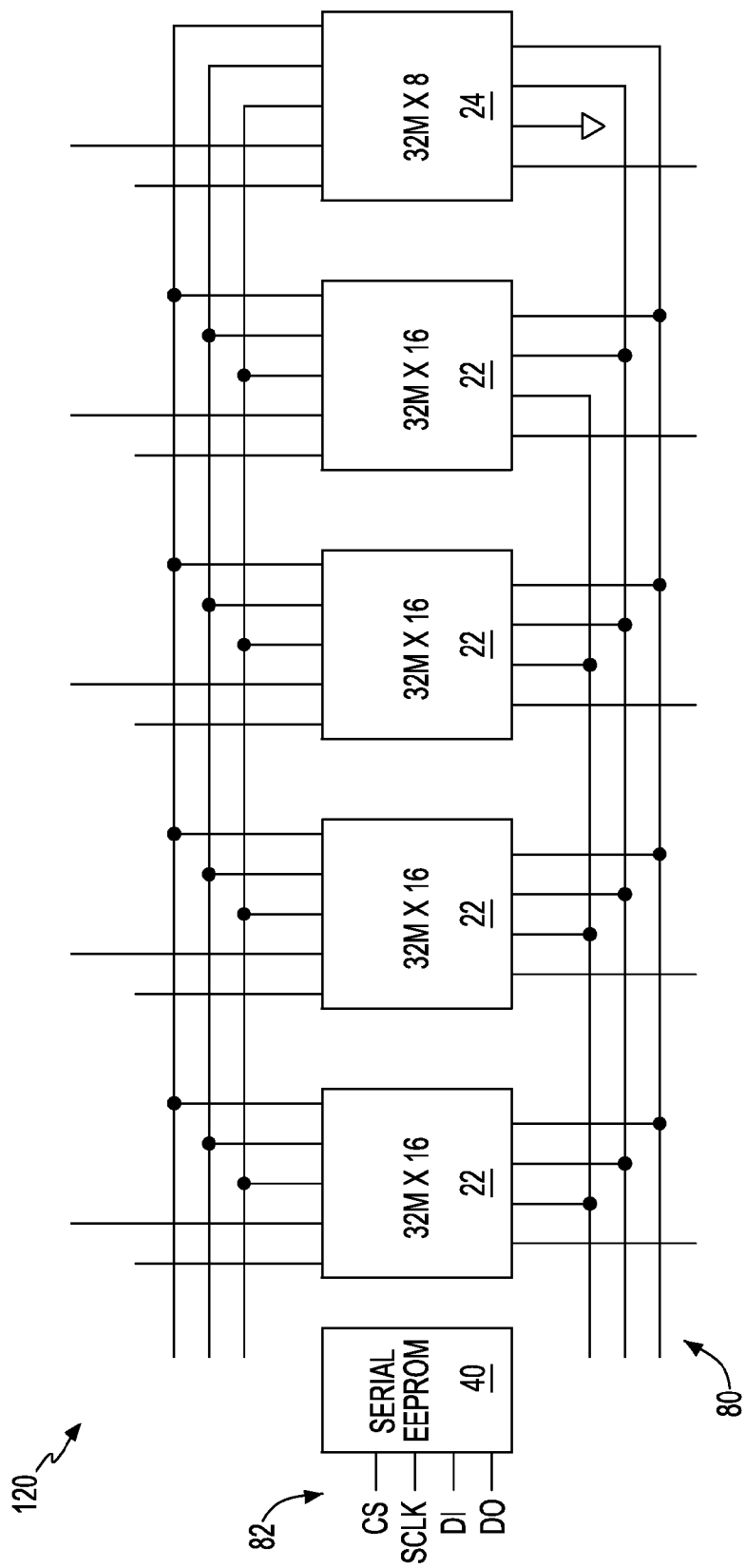
FIG. 3 is an electrical schematic diagram of the embodiment of the invention shown in FIG. 1.
Figure 4:
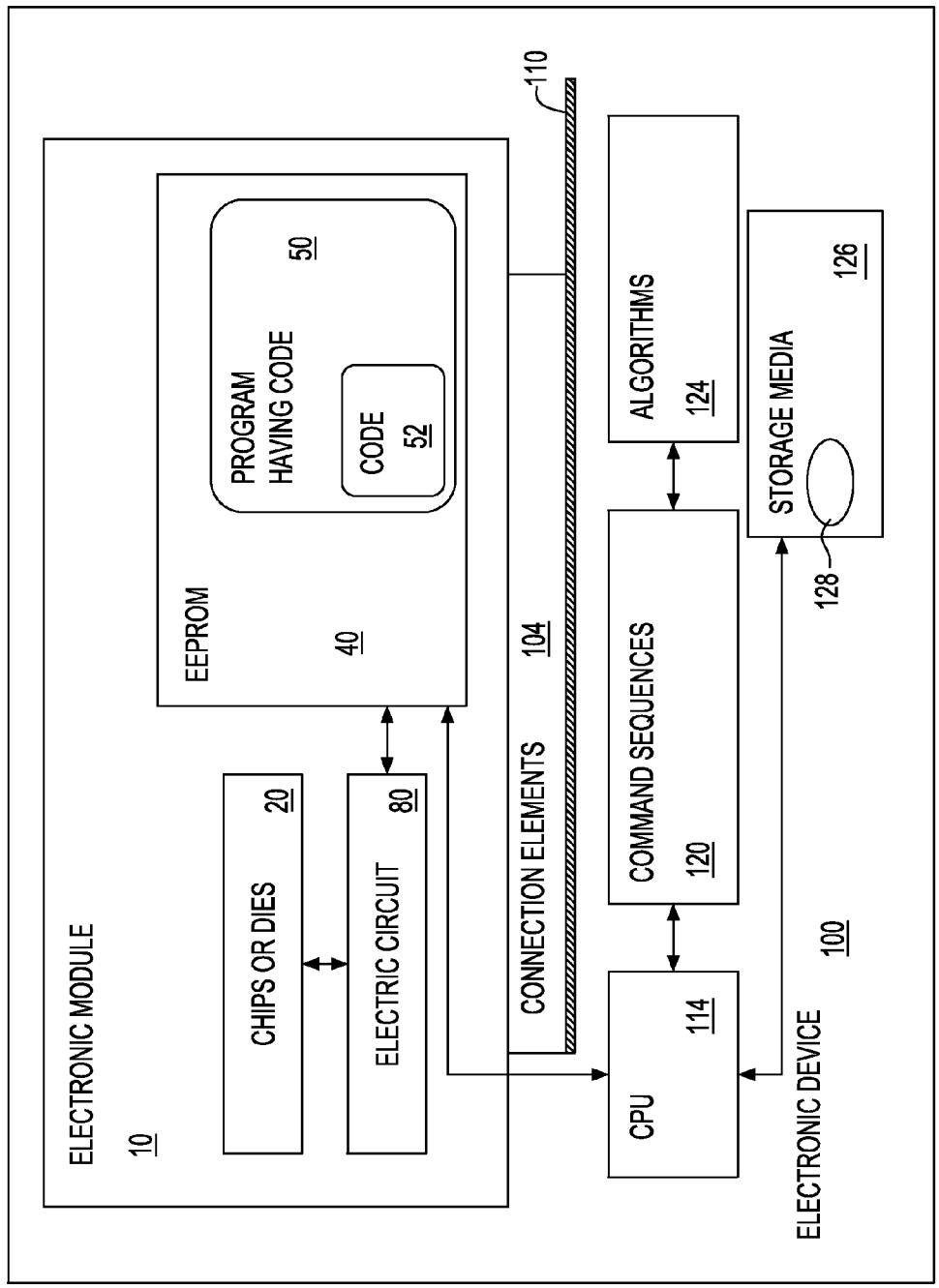
FIG. 4 is a schematic block diagram of the embodiment of the invention shown in FIG. 1.

The electronic module 10 is connected to a circuit board 110 having, for example, a memory interface embodied as a processor, wherein the processor is embodied as a central processing unit (CPU) 114 for the electronic device 100. In the embodiment of the invention shown in FIG. 4, a processor is embodied as a CPU 114, however, any memory interface may be used, such as a field programmable gate array (FPGA). A plurality of semiconductor devices embodied as chips 20 (also can be referred to as dies) electrically communicate with an electrical circuit 80 within the electronic module 10, as shown in FIGS. 3 and 4 and discussed more extensively below. The semiconductor devices 20 may be multiple instances of the same device, or different devices, or a combination of two or more devices. Additionally, the semiconductor devices 20 may include any non-volatile storage technology, or may include one or more of the following: a memory device, an integrated circuit, a die, a flash memory device (including NAND or NOR non-volatile storage technology), random access memory (RAM), or Magnetoresistive Random Access Memory (MRAM), or Phase Change Memory which is known as: PCME, PRAM, or PCRAM, or Ovonic Unified Memory, Chalcogenide RAM and C-Ram. Further, for example, each of the semiconductor devices 20 may be different memory devices. The chips 20 may be at different horizontal planar levels within the electronic module 10 as shown in FIG. 1. The electrical circuit 80 connects the dies 20 with the circuit board 110 using electrical connector elements, embodied as ball grid array (BGA) connectors 104.

A programmable memory device including non-volatile memory is embodied as Electrically Erasable Programmable Read-Only Memory (EEPROM) 40 (herein referred to as EEPROM or the programmable memory device). The programmable memory device may also be embodied as configuration memory, which includes types of memory technology, for example, Magnetoresistive Random Access Memory (MRAM), or a programmable read only memory (PROM). The EEPROM 40 is attached to a substrate layer 30 within the electronic module 10 using solder balls connectors 24. The programmable memory device 40 electrically communicates with the electrical circuit 80 of the electronic module 10. The programmable memory device 40 includes a program 50 which includes code 52 (or program code) saved in the programmable memory device 40 which is a non-transitory computer readable storage medium. The code 52 may be machine code or machine language, including a set of instructions, for execution by a processor including the CPU 114. The code 52 defines a multiplicity of functions for the electronic module 10 to enable communication between the electronic module 10 and the central processing unit 114 on the circuit board 110 of the electronic device 100. The BGA connectors 104 attach to a substrate 60 on a bottom side of the electronic module 10 for electrically connecting the electrical circuit 80 of the electronic module 10 to the circuit board 110 for communication between the programmable memory device 40 and the CPU 114.

Additionally, the non-volatile memory of the EEPROM 40 includes code directed to command sequences (or algorithms) that control various functions within the module 10. The functions include, for example: reading a device ID, or a manufacturers ID, programming a word; programming a byte; erasing a chip; or erasing a sector. Further, functions may include command sequences for: a flash ID; an electronic ID; a word program; a buffer program; a reset or chip reset command (RST); or checksum instructions, used for checking the integrity of data. Further, the program 50 and code 52 may include one or more of: a protocol for communication between components such as the module 10 and the CPU 114; read instructions; or write instructions. In one embodiment of the invention, a command sequence table for the module 10 is embedded within the EEPROM 40 of the module 10. The command sequence table may be stored in a specified format, for example, being error correcting code (ECC) protected, and wherein each table entry has 2 bytes of address information, 1 byte of address ECC, 2 bytes of data information and 1 byte of data ECC.

In operation, for example, a target hardware, which is the CPU 114 in the embodiment of the invention shown in FIGS. 1 and 4, reads a serial data stream from the serial EEPROM 40 of the electronic module 10. The CPU 114 parses the serial data stream into individual command sequences 120 for creating algorithms 124 needed to perform the functions listed in the commands, as in the functions and command listed above.

Referring to FIG. 3, the electrical circuit 80 is depicted in a schematic diagram which includes the EEPROM 40 and semiconductor devices 20 embodied as non-volatile memory elements, that is, four 32 megabyte by 16 bit memory devices 22, and a 32 megabyte by 8 bit memory device 24. Connection lines 26 connect the memory devices 22, 24, and ultimately connect to the electronic device 100, as described above. The EEPROM 40 may be connected in series or in parallel. The EEPROM 40 shown in FIG. 3. is in series, and various functions 82 are depicted as inputs/outputs including: chip select (CS), serial data clock (SCLK), data input (DI), and data output (DO).

Figure 2:
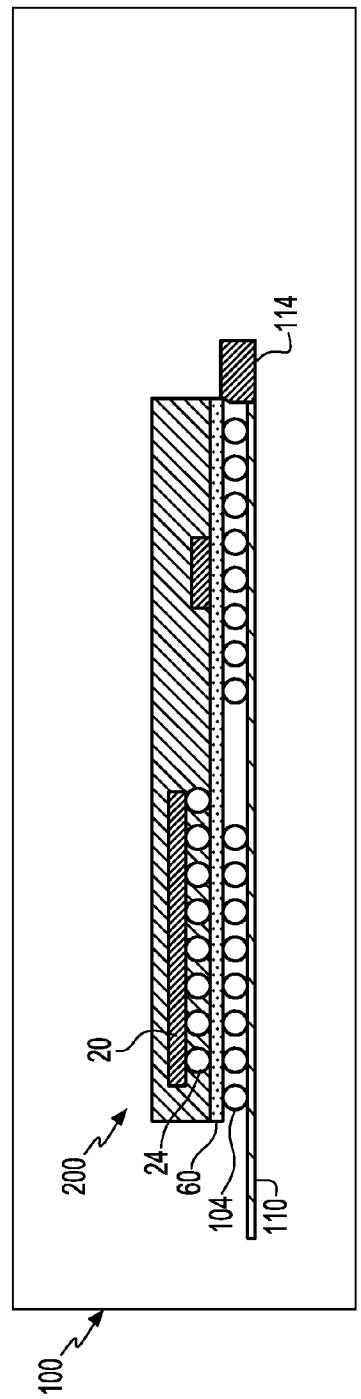
FIG. 2 is cross sectional side elevational view of an electronic device and planar electronic module according to another embodiment of the invention.

Referring to FIG. 2, in another embodiment of the invention wherein like reference numerals are used to reference the same elements, a planar physical building block module 200 is shown. The planar module 200 includes the die 20, and the EEPROM 40, both attached to the substrate 60. The BGA connectors 104 connect the module 200 to the circuit board 110 similarly to the module 10 shown in FIG. 1. In the embodiment of the invention shown in FIG. 2, the planar PBB module 200 allows for a low rise approach to providing an upgrade to the electronic device 100. The planar module 200 may include multiple dies 20 spread out over a planar surface, thus requiring more surface area than the stacked die type module shown in FIG. 1.

Figure 5:
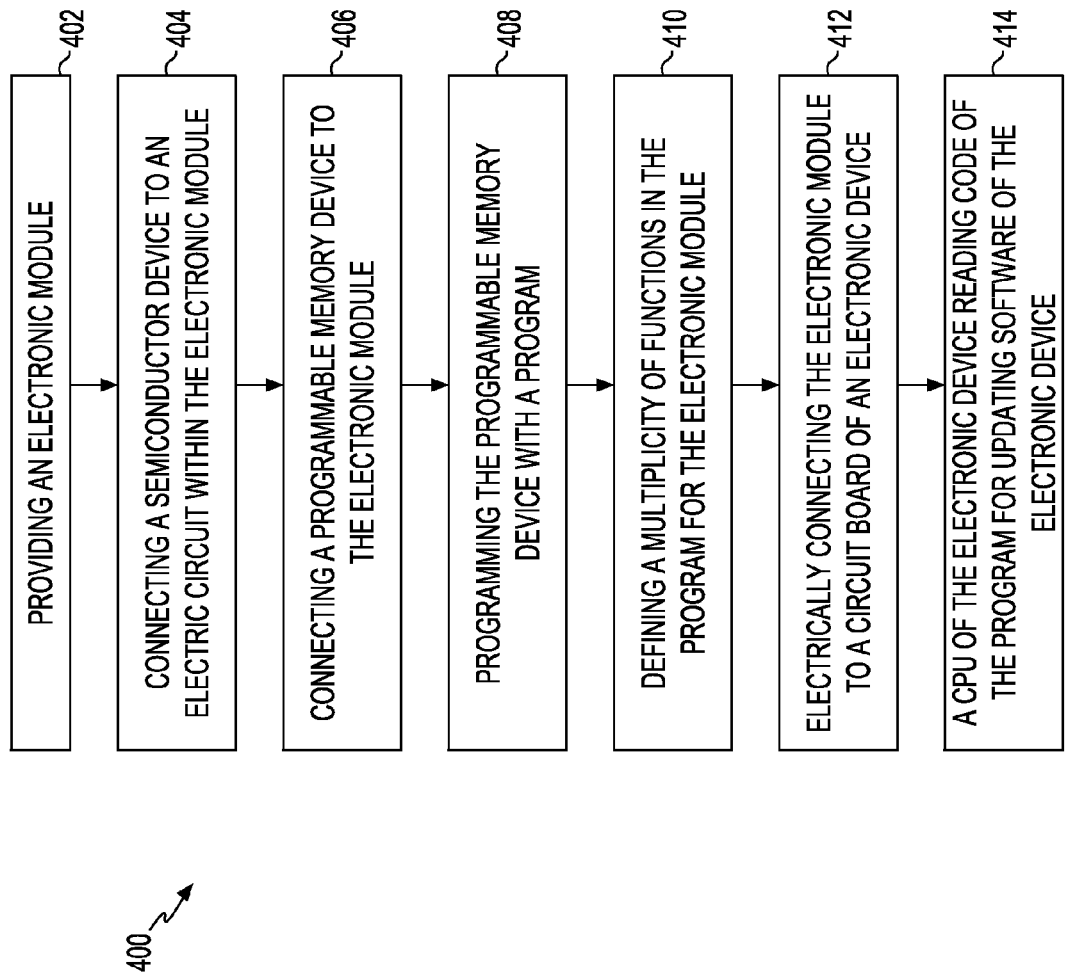
FIG. 5 is a flow chart of a method according to an embodiment of the invention related to the electronic device and module shown in FIG. 1.

Referring to FIG. 5, a method 400 according to an embodiment of the invention for updating an electronic device is described, using the same reference numerals for like elements of the embodiment of the invention shown in FIG. 1. The electronic module 10 is provided in step 402. Step 404 includes connecting the semiconductor device 20 to the electrical circuit 80 within the electronic module 10. Step 406 includes connecting the programmable memory device 40 which has non-volatile memory to the electronic module 10. Step 408 includes programming the programmable memory device 40 with the program 50 having the code 52 which is saved in the programmable memory device 40. Step 410 includes defining a multiplicity of functions for the electronic module 10 using the code 52, for communication between the electronic module 10 and the central processing unit 114 on the circuit board 110 of the electronic device 100. Step 412 includes electrically connecting the electronic module 10 to the circuit board 110 through the substrate 60 for communication between the CPU 114 of the electronic device and the programmable memory device 40. Step 414 includes the CPU 114 of the electronic device reading the code 52 of the program 50 for updating software 128 stored in an electronic storage medium 126 (e.g., non-transitory computer readable storage media) of the electronic device 100, which is associated with the CPU 114, as shown in FIG. 4.

Therefore, by the electronic module and method disclosed, an upgrade of the electronic device, for example, a new encapsulated semiconductor module which may be embodied as upgraded flash memory, is enabled without the manual upgrading, e.g., reprogramming, of the software of the electronic device. Consequently, in accordance with the present disclosure, the electronic device does not need re-certified with every hardware and software upgrade. Thereby, cost and labor time associated with the upgrade are both favorably reduced.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method of upgrading with a new encapsulated semiconductor module an electronic device including a non-transitory computer readable storage medium having embodied therein software, the method comprising:
   operatively connecting the new encapsulated semiconductor module to a memory interface of the electronic device, wherein the new encapsulated semiconductor module includes non-volatile memory, wherein the new encapsulated semiconductor module has saved therein before being operatively connected to the memory interface of the electronic device a program having code to be used to generate command sequences for updating the software embodied in the non-transitory computer readable storage medium of the electronic device, and wherein the memory interface is configured to communicate with the non-transitory computer readable storage medium of the electronic device;
   reading, by the memory interface, the program code of the new encapsulated semiconductor module;
   generating command sequences, by the memory interface, using the program code read from the new encapsulated semiconductor module; and
   updating by the memory interface, based upon the generated command sequences, the software embodied in the non-transitory computer readable storage medium of the electronic device.

2. The method of claim 1, further comprising creating by the memory interface, based upon the generated command sequences, algorithms for performing data functions.

3. The method of claim 1, wherein the updating the software embodied in the non-transitory computer readable storage medium does not require recertification of the electronic device.

4. The method of claim 1, wherein the memory interface comprises a CPU.

5. The method of claim 1, wherein the new encapsulated semiconductor module comprises an EEPROM.

6. A method of upgrading with a new encapsulated semiconductor module an electronic device including a non-transitory computer readable storage medium having embodied therein software, the method comprising:
   operatively connecting the new encapsulated semiconductor module to a memory interface of the electronic device through an electronic module, wherein the new encapsulated semiconductor module includes non-volatile memory, wherein the new encapsulated semiconductor module has saved therein before being operatively connected through the electronic module to the memory interface of the electronic device a program having code to be used to generate command sequences for updating the software embodied in the non-transitory computer readable storage medium of the electronic device, and wherein the memory interface is configured to communicate with the non-transitory computer readable storage medium of the electronic device;
   reading, by the memory interface, the program code of the new encapsulated semiconductor module;
   generating command sequences, by the memory interface, using the program code read from the new encapsulated semiconductor module; and
   updating by the memory interface, based upon the generated command sequences, the software embodied in the non-transitory computer readable storage medium of the electronic device.

7. The method of claim 6, further comprising creating by the memory interface, based upon the generated command sequences, algorithms for performing data functions.

8. The method of claim 6, wherein the updating the software embodied in the non-transitory computer readable storage medium does not require recertification of the electronic device.

9. The method of claim 6, wherein the memory interface comprises a CPU.

10. The method of claim 6, wherein the new encapsulated semiconductor module comprises an EEPROM.

11. The method of claim 1, wherein the program code comprises a protocol for communication with the memory interface of the electronic device.

12. The method of claim 6, wherein the program code comprises a protocol for communication with the memory interface of the electronic device.

\* \* \* \* \*